(12) United States Patent
Tavares

(10) Patent No.: US 8,901,982 B1
(45) Date of Patent: Dec. 2, 2014

(54) DELAY LINE CALIBRATION CIRCUIT AND METHOD

(71) Applicant: Xilinx, Inc., San Jose, CA (US)

(72) Inventor: Austin S. Tavares, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/136,276

(22) Filed: Dec. 20, 2013

(51) Int. Cl.
*H03K 5/14* (2014.01)
(52) U.S. Cl.
CPC .......................................... *H03K 5/14* (2013.01)
USPC ............ 327/276; 327/270; 327/271; 327/277
(58) Field of Classification Search
CPC .................................. H03K 5/14; H03K 5/133
USPC ......... 327/276, 161, 263, 264, 269, 270, 271, 327/272, 277, 278, 284, 285
See application file for complete search history.

(56) References Cited

U.S. PATENT DOCUMENTS

| | | | | |
|---|---|---|---|---|
| 6,919,749 | B2 * | 7/2005 | Alon et al. | 327/277 |
| 7,197,099 | B2 * | 3/2007 | Dosaka | 375/371 |

* cited by examiner

*Primary Examiner* — Lincoln Donovan
*Assistant Examiner* — Jung H Kim
(74) *Attorney, Agent, or Firm* — LeRoy D. Maunu; Frederick Hsu

(57) ABSTRACT

In an approach for calibrating a delay line having a plurality of taps, a first clock signal is input to the delay line. A second clock signal is input to a reference circuit having a plurality of taps. In response to determining that output signals of selected taps of the delay line and reference circuit do not align, a next tap of the reference circuit is selected, to determine whether or not the output signals align. In response to determining that the output signals align, reference tap data indicative of the current reference tap is stored in association with a delay tap number of the current delay tap. A next tap of the delay line is selected to determine whether or not the output signals align.

10 Claims, 5 Drawing Sheets

| calibration table /128 | |
|---|---|
| delay tap # (402) | ref. tap # (404) |
| 0 | 5 |
| 1 | 7 |
| 2 | 14 |
| 3 | 21 |
| 4 | 27 |
| 5 | 32 |
| 6 | 39 |
| 7 | 46 |
| 8 | 51 |
| 9 | 55 |
| 10 | 62 |
| 11 | 69 |
| 12 | 74 |
| 13 | 77 |
| 14 | 80 |
| 15 | 84 |
| 16 | 86 |
| 17 | 89 |
| 18 | 92 |
| 19 | 96 |
| 20 | 98 |
| 21 | 101 |
| 22 | 103 |

DELAY LINE CALIBRATION CIRCUIT AND METHOD

FIELD OF THE INVENTION

The disclosure generally relates to calibration of delay lines.

BACKGROUND

Delay lines may be used for adjusting the timing of various signals in an electronic system. A delay line may have multiple serially connected delay elements with an input signal being delayed by each delay element. The outputs of the delay elements may be tapped to provide the input signal delayed by different amounts. The taps of the delay line may be selectable such that one of the taps is selected to provide the input signal delayed by a desired amount.

In one application, a delay line may be used to adjust a clock signal for reliably sampling a data signal. The delay line may cover the entire eye pattern of a data signal so that one of the taps may be selected to satisfy the setup and hold times for sampling the data signal. Determining which tap to use to sample the data signal may be problematic because of non-linearity of the delay line. That is, each delay element of the delay line may introduce a different amount of delay. In some systems, delay lines may be specifically designed to reduce the non-linearity. However, such delay lines tend to be expensive in terms of circuit resources.

SUMMARY

According to a method of calibrating a delay line, the delay line has a plurality of taps, and a first clock signal is input to the delay line. A second clock signal is input to a reference circuit. The reference circuit also has a plurality of taps. A first tap of the delay line is selected as a current delay tap, and a first tap of the reference circuit is selected as a current reference tap. The method determines whether or not output signals of the current delay tap and the current reference tap align. In response to determining that the output signals do not align, a next tap of the reference circuit is selected as the current reference tap, and the method repeats the determining whether or not the output signals align. In response to determining that the output signals align, the method stores reference tap data indicative of the current reference tap in association with a delay tap number of the current delay tap, selects a next tap of the delay line as the current delay tap, and repeats the determining whether or not the output signals align.

A calibration circuit includes a delay line, a reference circuit, an alignment detector, a memory, and a control circuit. The delay line has a plurality of delay taps and is configured to input a first clock signal and provide an output signal from a selected one of the delay taps. The reference circuit has a plurality of reference taps and is configured to input a second clock signal and provide an output signal from a selected one of the reference taps. The alignment detector is coupled to receive the output signals of the delay line and of the reference circuit. The alignment detector is configured to output an alignment signal that indicates whether or not the output signals of the delay line and of the reference circuit are aligned. The control circuit is coupled to the delay line, the reference circuit, the alignment detector, and to the memory. The control circuit is configured to select taps of the delay line and the reference circuit and store reference tap data in response to the alignment signal from the alignment detector indicating alignment of the output signals of the delay line and the reference circuit. The reference tap data indicates a selected reference tap in association with a delay tap number of a selected delay tap.

Another method of calibrating a delay line, which has a plurality of taps, includes inputting a first clock signal to the delay line. A second clock signal is input to a reference circuit, which also has a plurality of taps. A first tap of the delay line is selected as a current delay tap, and a first tap of the reference circuit is selected as a current reference tap. The method determines whether or not edges of output signals of the current delay tap and the current reference align. In response to determining that the edges do not align, a next tap of the reference circuit is selected as the current reference tap, and the method repeats the determining whether or not the edges align. In response to determining that the edges align, the method stores a reference tap number of the current reference tap in association with a delay tap number of the current delay tap, selects a next tap of the delay line as the current delay tap, and repeats the determining whether or not the edges align.

Other features will be recognized from consideration of the Detailed Description and Claims, which follow.

BRIEF DESCRIPTION OF THE DRAWINGS

Various aspects and features of the circuit and method will become apparent upon review of the following detailed description and upon reference to the drawings in which.

DETAILED DESCRIPTION OF THE DRAWINGS

The approaches for calibrating a delay line use an alignment detector to determine when the output of a selected tap of the delay is aligned with the signal from a selected tap of a fine phase reference circuit. A control circuit steps through the taps of the reference circuit until alignment is detected. When alignment of the signals is detected, the tap number of the selected tap of the reference circuit is recorded in association with the tap number of the selected tap of the delay line. Each tap of the delay line is processed in this manner.

The recorded calibration data may then be used to determine which tap of the delay line may be suitable for sampling a data signal. The total delay introduced by the delay line is greater than the duration of a pulse of the data signal. The delay line can thereby be used to determine which tap outputs a signal having a leading edge that aligns with a leading edge of a pulse of the data signal, and which tap outputs a signal having a leading edge that aligns with a trailing edge of the pulse. Using the stored delay tap numbers and associated reference tap numbers, the edge reference tap numbers are determined. The edge reference tap numbers are those associated with the delay tap numbers of the taps determined to output signals that align with the leading and trailing edges of a pulse of the data signal. A center delay tap number may be determined as a function of the edge reference tap numbers.

Figure 1:
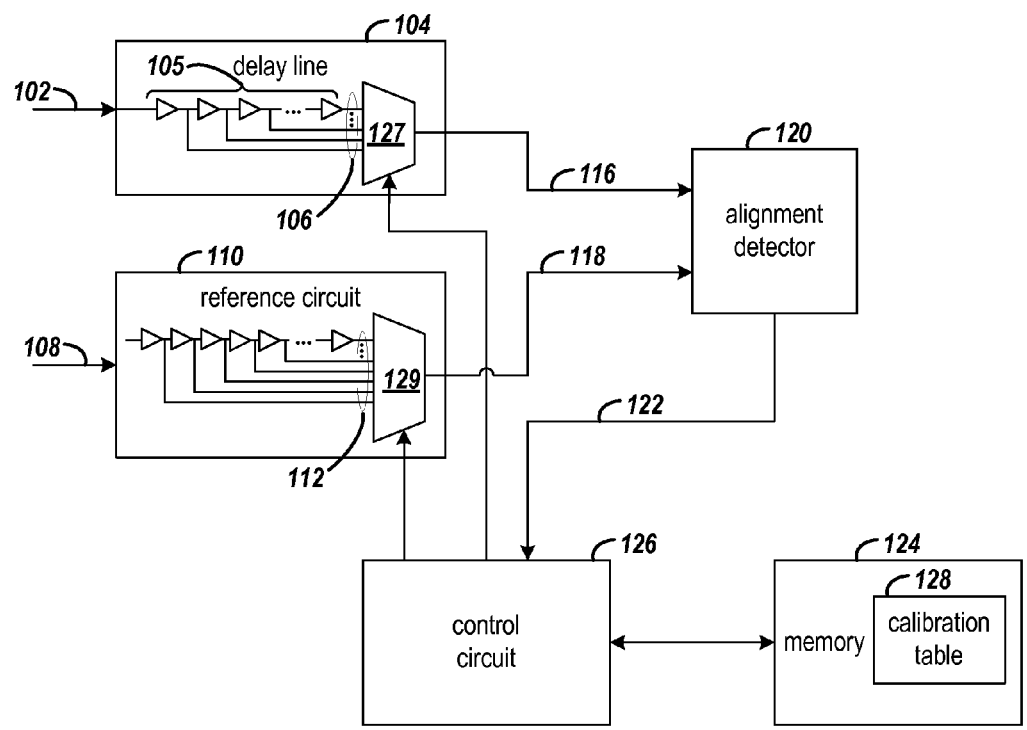
FIG. 1 is a block diagram of a circuit for calibrating a delay line.

FIG. 1 is a block diagram of a circuit for calibrating a delay line. The delay line 104 inputs a clock signal on line 102. For ease of description, signals will be referenced by the lines on which they are carried. The delay line has serially connected delay elements 105 and multiple taps 106, which provide output signals from the delay elements, respectively.

A second clock signal 108 is input to the reference circuit 110. The reference circuit also has multiple taps 112. The reference circuit may be a phase-locked loop, another delay line, or a mixed-mode phase mixing clock manager module such as is available for field programmable gate arrays (FPGAs) from Xilinx, for example. The taps of the reference circuit are finer than the taps of the delay line. That is, the delay between each two taps of the reference circuit is less than the delay between each two taps of the delay line.

The control circuit 126 selects the first tap of the delay line as a current delay tap and selects the first tap of the reference circuit as a current reference tap. The control circuit selects the signals from the current delay tap and the current reference tap by control signals provided to multiplexers 127 and 129. The alignment detector 120 determines whether or not the output signals 116 and 118 of the current delay tap and the current reference tap align. The alignment detector may be an edge detector or a phase detector depending on implementation requirements. If a phase detector is used, the clock signals 102 and 108 for the delay line and the reference circuit must have the same frequency. If an edge detector is used, the reference clock signal 108 may be slower than the delay line clock signal 102.

The alignment detector 120 outputs an alignment signal 122 that indicates whether or not the output signals 116 and 118 of the delay line and of the reference circuit are aligned. If the alignment detector is an edge detector, the alignment signal 122 indicates whether or not the edges of the signals 116 and 118 align. For example, in one implementation the alignment signal indicates whether or not the leading edge of signal 118 of the current reference tap aligns with the trailing edge of signal 116 of the current delay tap. An alternative implementation may detect the leading edge of the output signal from the delay line.

Depending on the state of the alignment signal, the control circuit 126 may store reference tap data and/or select new taps to be used as the current taps. In response to the alignment signal indicating that the signals 116 and 118 do not align, the control circuit 126 selects a next tap of the reference circuit (via multiplexer 129) to be used as the current reference tap, and the alignment detector checks for alignment of the signal 116 with output signal 118 of the new current reference tap.

In response to the alignment signal 122 indicating that the signals 116 and 118 align, the control circuit 126 stores reference tap data in the calibration table 128, which is maintained in memory 124. In one implementation, the calibration table includes the delay tap numbers and associated reference tap numbers. The associated reference tap numbers are the current reference tap numbers when the signals 116 and 118 were found to align with the delay taps. In another implementation, the reference tap data may be the difference between the current reference tap number determined to align with the current delay tap and the reference tap number determined to align with the preceding delay tap.

After the alignment signal 122 indicates alignment of the signals 116 and 118 and the control circuit 126 has stored the reference tap data, the control circuit selects the next tap of the delay line to be used as the current delay tap. The alignment detector then determines whether or not the output signal 116 of the new current delay tap aligns with the current reference tap.

In one implementation, memory 124 may be an on-chip memory, such as block RAM of an FPGA. Alternatively, the memory may be a dedicated set of registers, either in an FPGA or in an application specific integrated circuit (ASIC).

Figure 2:
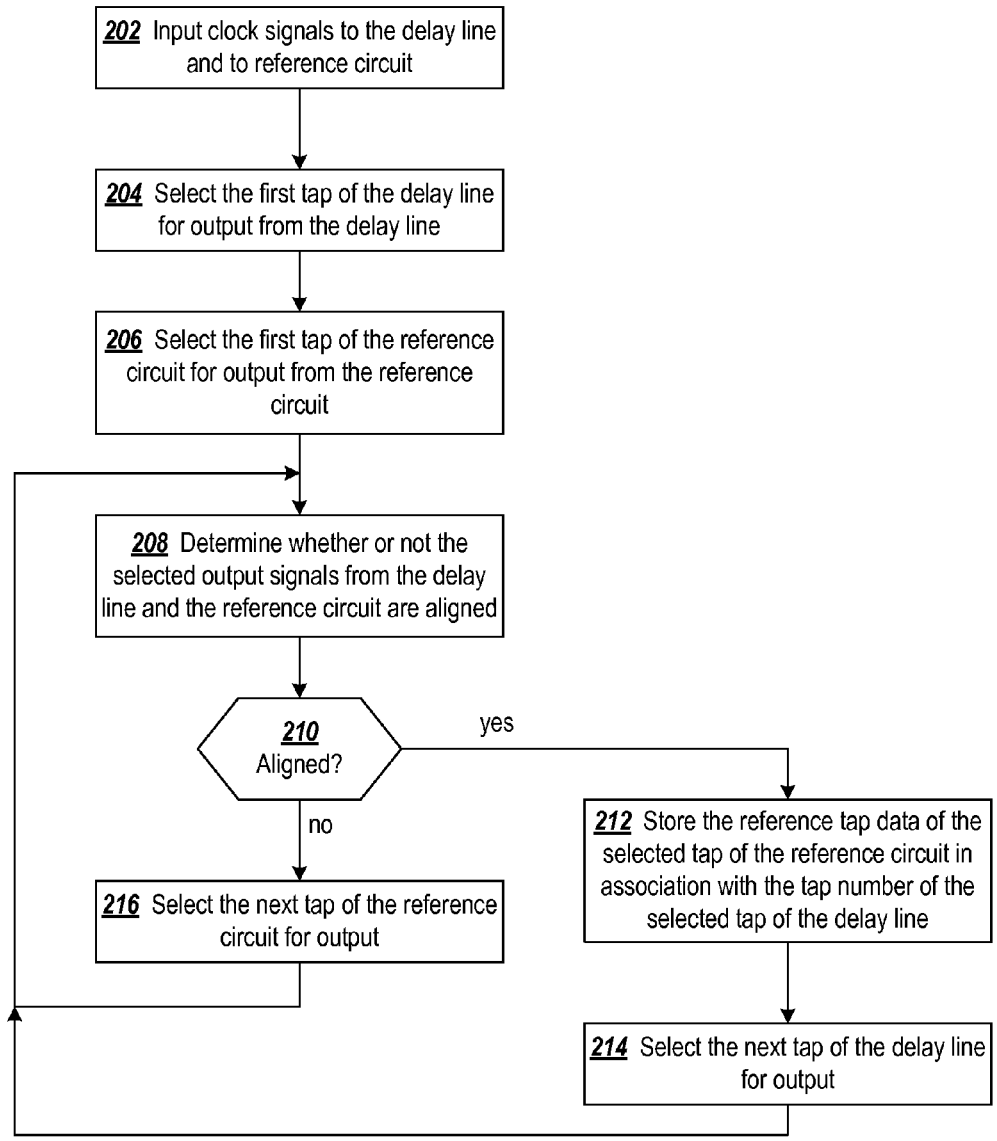
FIG. 2 is a flow chart of a process for calibrating a delay line.

FIG. 2 is a flow chart of a process for calibrating a delay line. At block 202, respective clock signals are input to the delay line and to a reference circuit. The first tap of the delay line is selected for the signal to be output from the delay line at block 204, and the first tap of the reference circuit is selected for the signal to be output from the reference circuit at block 206.

At block 208, the process determines whether or not the output signals from the delay line and the reference circuit are aligned. In one implementation, the process determines whether or not edges of the output signals align. In an alternative implementation, the process determines whether or not phases of the output signals align.

If the signals are aligned, decision block 210 directs the process to block 212 where the reference tap data indicative of the selected reference tap and the delay tap number of the selected delay tap are associatively stored in a memory. At block 214, the next delay tap is selected for providing the output signal from the delay line, and the process continues at block 208. Though not shown in the flow chart, it will be appreciated that the process halts once all the taps of the delay line have been processed.

If the signals are not aligned, decision block 210 directs the process to block 216 where the next tap of the reference circuit is selected for providing the reference signal. The process then continues at block 208.

Figure 3:
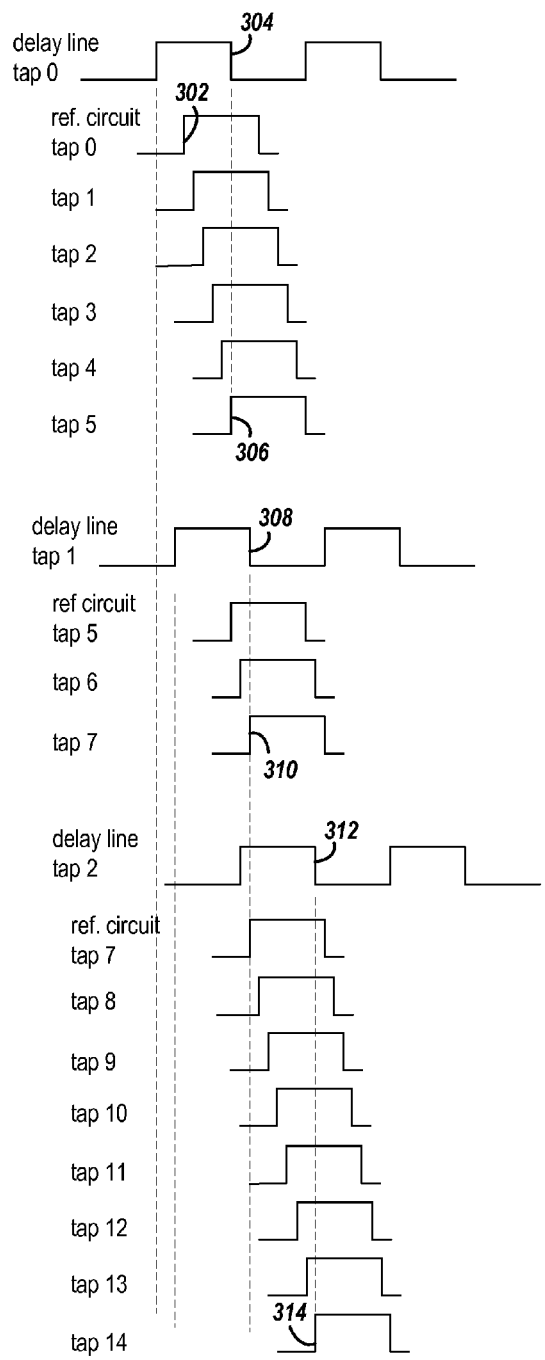
FIG. 3 is a timing diagram that shows detecting alignment of edges of a reference circuit signal and the signals from three delay line taps.

FIG. 3 is a timing diagram that shows detecting alignment of edges of a reference circuit signal and the signals from three delay line taps. The example shows edge alignment when the trailing edge of the signal from the delay line tap aligns with the leading edge of the signal from the selected tap of the reference circuit.

At the top of the diagram, tap 0 of the delay line is selected first along with tap 0 of the reference circuit. Since the leading edge 302 of the signal from tap 0 of the reference circuit is not aligned with the trailing edge 304 of the signal from tap 0 of the delay line, the signals do not align. The previously described circuitry and process select the next tap (tap 1) of the reference circuit and again check alignment. The process continues until alignment is detected with the signal from tap 5 of the reference circuit. Edge 306 of the signal from tap 5 of the reference circuit aligns with edge 304 of the signal from tap 0 of the delay line.

As described above, once alignment is detected, an alignment signal (not shown) may be used to signal alignment, and reference tap data may be stored in association with the delay tap number 0. For example, the reference tap number 5 may be associatively stored with delay tap number 0.

Once reference tap 5 is determined to be aligned with delay tap 0, delay tap 1 is selected. Alignment detection begins with tap 5 of the reference circuit. The edges of the signals from taps 5 and 6 are not aligned with edge 308 of the signal from delay tap 1. The edge 310 of the signal from tap 7 is aligned with edge 308 of the signal from tap 1 of the delay line, and reference tap data that is indicative of tap 7 is stored in association with delay tap number 1.

Once reference tap 7 is determined to be aligned with delay tap 1, delay tap 2 is selected. Alignment detection begins with tap 7 of the reference circuit. The edges of the signals from taps 7 through 13 are not aligned with edge 312 of the signal from delay tap 2. The edge 314 of the signal from tap 14 is aligned with edge 312 of the signal from tap 2 of the delay line, and reference tap data that is indicative of tap 14 is stored in association with delay tap number 2.

Figures 4, 5:
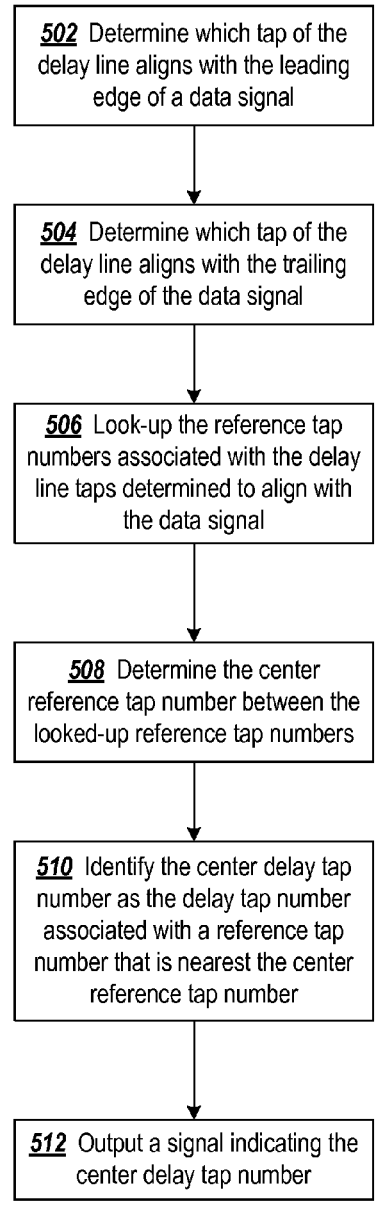
FIG. 4 shows a calibration table populated with example values.
FIG. 5 is a flowchart of a process for using the delay line calibration data for determining a delay tap to use to sample a data signal.

FIG. 4 shows a calibration table populated with example values. The calibration table 128 is populated with examples of delay tap numbers 402 and associated reference tap numbers 404. The table has entries for delay taps numbered 0 through 22. The numbers of the reference taps that provide signals that align with the signals from the respective delay taps are adjacent to the delay tap numbers. For example, the signal from reference tap 5 is aligned with the signal from delay tap 0.

In an alternative implementation, instead of storing the reference tap numbers, differences between successive reference tap numbers whose signals align with successive delay taps may be stored in association with the delay tap numbers. For example, instead of storing reference tap numbers 5, 7, 14, 21, . . . in association with delay tap numbers 0, 1, 2, 3, . . . , the stored differences would be 5, 2, 7, 7, . . . for delay tap numbers 0, 1, 2, 3, . . . Storing the differences instead of the reference tap numbers requires less memory space since the differences would have a smaller magnitude. However, more logic would be required to perform the calculations.

FIG. 5 is a flowchart of a process for using the delay line calibration data for determining a delay tap to use to sample a data signal. The delay line has a total delay that covers the eye pattern of a data signal. Since the delay line is non-linear, the data in the calibration table may be used to advantageously select a suitable tap of the delay line. The process of FIG. 5 determines which taps of the delay line provide the signals that align with edges of a pulse of the data signal and uses the calibration data to select a suitable delay line tap for sampling the data signal.

At block 502, the tap of the delay line that provides a signal that aligns with the leading edge of a pulse of the data signal is determined, and at block 504, the tap of the delay line that provides a signal that aligns with the trailing edge of the pulse of the data signal is determined. At block 506, the process determines the reference tap numbers that are associated with the delay tap numbers determined at blocks 502 and 504. These reference tap numbers are referred to as edge reference tap numbers and may be looked up in the calibration table.

A center reference tap number is determined at block 508. The center reference tap number is a function of the edge reference tap numbers. In one implementation, the center reference tap number is one-half the difference between edge reference tap numbers plus the edge reference tap number aligned with the leading edge of the data pulse. Using the data in the calibration table of FIG. 4, for example, if the leading edge of the data signal pulse is determined to align with the signal from delay tap 2, and the trailing edge is determined to align with the signal from delay tap 22, the associated edge reference tap numbers are 14 and 103. The pulse width is 89 taps of the reference circuit (103-14), and the middle of the pulse width is 44.5 taps. The center of the pulse in the reference circuit would then be 58.5 taps (44.5+14). From the table of FIG. 4, it can be seen that 58.5 is half way between reference tap numbers 55 and 62, which are associated with delay tap numbers 9 and 10, respectively. At block 510, the center delay tap number is identified as the delay tap number that is nearest the determined center reference tap number. In the example, either delay tap 9 or 10 may be selected as the center delay tap number. At block 512, the center delay tap number is output so that it may be used with the delay line in a target application.

In an alternative implementation, which may reduce the amount of logic, the center reference tap number may be determined as one-half the difference between edge reference tap numbers. Using the previous example, the leading edge of the data signal pulse is determined to align with the signal from delay tap 2, and the trailing edge is determined to align with the signal from delay tap 22. The associated edge reference tap numbers are 14 and 103. The center reference tap number is (14+103)/2=44.5. From the table of FIG. 4, it can be seen that 44.5 is nearest reference tap number 46, which is associated with delay tap number 7. Thus, delay tap number 7 may be selected as the center delay tap number.

Figure 6:
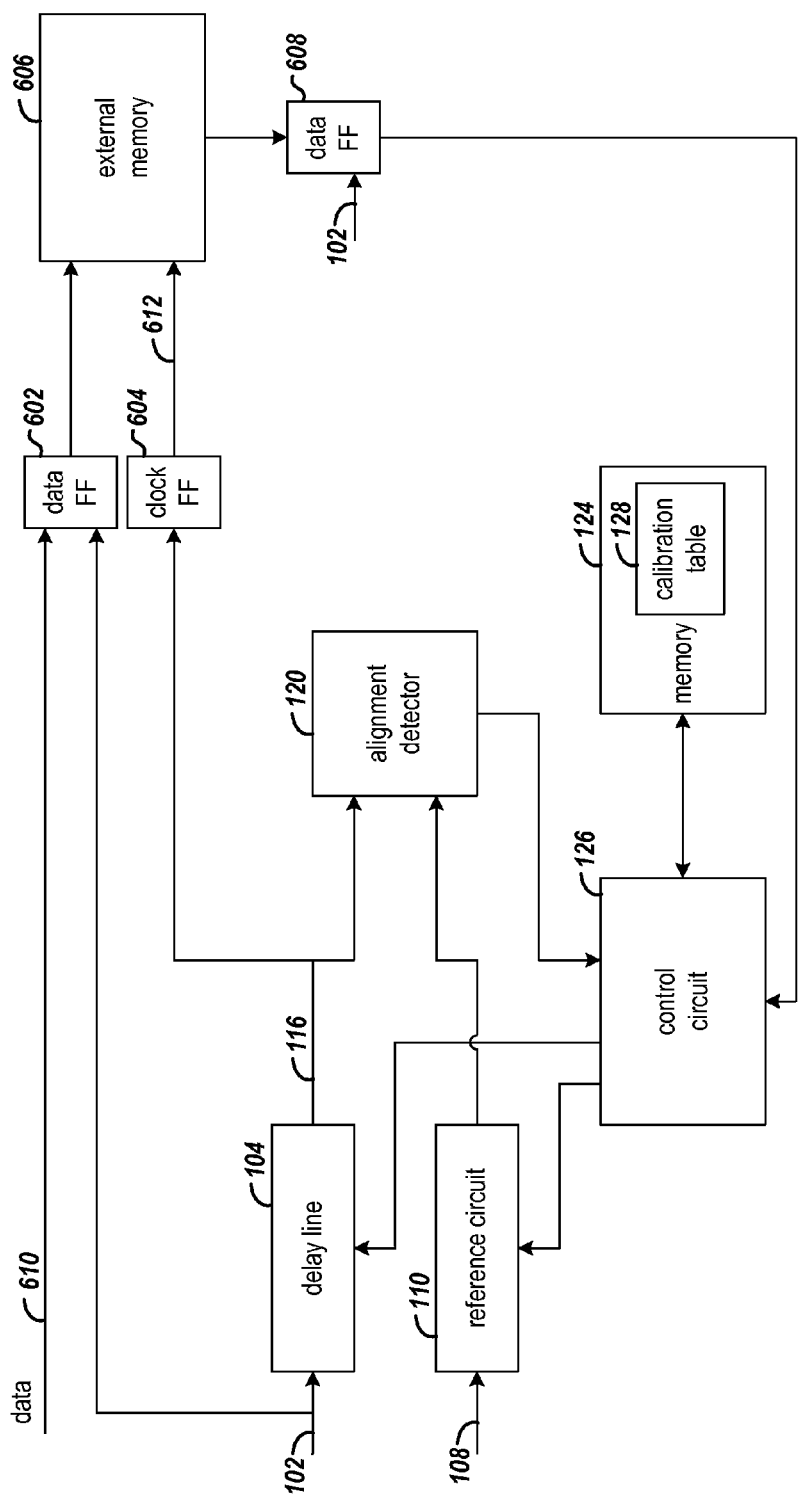
FIG. 6 is a block diagram of a circuit for calibrating a delay line and using the delay line calibration data for determining a delay tap to use for sampling a data signal.

FIG. 6 is a block diagram of a circuit for calibrating a delay line and using the delay line calibration data for determining a delay tap to use for sampling a data signal. The delay line 104, reference circuit 110, alignment detector 120, and control circuit 126 operate as described in the description of FIG. 1. The control circuit is further configured to use the data in the calibration table 128 to determine which tap of the delay line 104 to use to sample data.

The control circuit uses data flip-flop (FF) 602, clock flip-flop 604, external memory 606, and data FF 608 to determine which taps of the delay line 104 align with the leading and trailing edges of a data pulse of data signal 610. Data is captured in data FF 602 and provided as input to the external memory 606. The data FF 602 is clocked by the clock signal that is input to the delay line. The output signal 116 from the delay line, which is the signal from one of the taps selected by the control circuit 126, drives clock FF 604. The clock FF 604 drives the clock signal 612 to the external memory in response to the output signal 116 from the delay line. Note that the data signal 610 represents both address and data signals to the external memory.

When the selected tap from delay line 104 provides a clock signal with a leading edge within the eye pattern of the data signal 610, the data pattern read from the external memory 606 by the control circuit will be the same as the data pattern written to the external memory. When the selected tap from delay line 104 provides a clock signal with a leading edge outside the eye pattern of the data signal 610, the data pattern read from the external memory by the control circuit will not be the data pattern expected by the control circuit. The control circuit steps through the taps of the delay line 104, and in each step writes data to the external memory 606 via data FF 602 and reads data from the external memory via data FF 608. The first tap of the delay line at which the expected data is correctly read from the external memory is determined to be the tap that provides the signal having a leading edge that aligns with the leading edge of the data eye pattern. The last tap of the delay line at which the data read from the external memory does not match the expected data is determined to be the tap that provides the signal having a leading edge that aligns with the trailing edge of the data eye pattern.

By using an external memory 606 to determine the taps of the delay line that align with the data eye pattern, the calibration accounts for the circuitry between the calibration circuitry and the targeted external memory. For example, there may be an assortment of drivers, channels, and receiver circuitry between the data FF 602 and clock FF 604 and the external memory.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for calibrating delay lines. Other aspects and features will be apparent to those skilled in the art from consideration of the specification. The circuits and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method of calibrating a delay line, comprising:
   inputting a first clock signal to the delay line wherein the delay line has a plurality of taps;
   inputting a second clock signal to a reference circuit, wherein the second clock signal is different from the first clock signal and the reference circuit has a plurality of taps;
   selecting a first tap of the delay line as a current delay tap;
   selecting a first tap of the reference circuit as a current reference tap;
   determining whether or not output signals of the current delay tap and the current reference tap align;
   in response to determining that the output signals do not align:
      repeating a selection of a next tap of the reference circuit as the current reference tap and a determination of whether or not the output signals align until the output signals align:
      storing reference tap data indicative of the current reference tap in association with a delay tap number of the current delay tap;
      selecting a next tap of the delay line as the current delay tap; and
      repeating the determining whether or not the output signals align.

2. The method of claim 1, wherein the determining whether or not output signals of the current delay tap and the current reference tap align includes determining whether or not edges of the output signals from the current delay tap and current reference tap align.

3. The method of claim 1, wherein the determining whether or not output signals of the current delay tap and the current reference tap align includes determining whether or not phases of the output signals from the current delay tap and current reference tap align.

4. The method of claim 1, wherein the reference tap data is a reference tap number.

5. The method of claim 1, wherein the reference tap data is a difference between a reference tap number of the current reference tap and a reference tap number of a reference tap at which the output signals were determined to align for a preceding delay tap.

6. The method of claim 1, wherein the reference tap data is a reference tap number, and the method further comprises:
   determining which tap of the delay line outputs a signal having a leading edge that aligns with a leading edge of a data signal;
   determining which tap of the delay line outputs a signal having a leading edge that aligns with a trailing edge of the data signal;
   determining which of the reference tap data indicate edge reference tap numbers, wherein the edge reference tap numbers are reference tap numbers associated with delay tap numbers of the taps of the delay line determined to output signals having leading edges that align with the leading and trailing edges of the data signal;
   determining a center delay tap number as a function of the edge reference tap numbers; and
   outputting the center delay tap number.

7. The method of claim 6, wherein the determining of the center delay tap number as the function of the edge reference tap numbers includes:
   determining a middle number that is centered between the edge reference tap numbers; and
   determining the center delay tap number as the delay tap number associated with a reference tap number nearest the middle number.

8. A method of calibrating a delay line, comprising:
   inputting a first clock signal to the delay line, wherein the delay line has a plurality of taps;
   inputting a second clock signal to a reference circuit, wherein the reference circuit has a plurality of taps;
   selecting a first tap of the delay line as a current delay tap;
   selecting a first tap of the reference circuit as a current reference tap;
   determining whether or not edges of output signals of the current delay tap and the current reference tap align;
   in response to determining that the edges do not align:
      repeating a selection of a next tap of the reference circuit as the current reference tap and a determination of whether or not the edges align until the edges align:
      storing a reference tap number of the current reference tap in association with a delay tap number of the current delay tap;
      selecting a next tap of the delay line as the current delay tap; and
      repeating the determining whether or not the edges align.

9. The method of claim 8, further comprising:
   determining which tap of the delay line outputs a signal having a leading edge that aligns with a leading edge of a data signal;
   determining which tap of the delay line outputs a signal having a leading edge that aligns with a trailing edge of the data signal;
   determining which of the stored reference tap numbers are edge reference tap numbers, wherein the edge reference tap numbers are reference tap numbers associated with delay tap numbers of the taps of the delay line determined to output signals having leading edges that align with the leading and trailing edges of the data signal;
   determining a center delay tap number as a function of the edge reference tap numbers; and
   outputting the center delay tap number.

10. The method of claim 9, wherein the determining of the center delay tap number as the function of the edge reference tap numbers includes:
   determining a middle number that is centered between the edge reference tap numbers; and
   determining the center delay tap number as the delay tap number associated with a reference tap number nearest the middle number.

* * * * *